United States Patent [19]

Takahashi et al.

[11] Patent Number: 5,113,336
[45] Date of Patent: May 12, 1992

[54] TEMPERATURE COMPENSATED LEVEL DETECTOR

[75] Inventors: Sunao Takahashi, Sendai; Mikio Takano, Ohme, both of Japan

[73] Assignee: Kokusai Electric Co., Ltd., Tokyo, Japan

[21] Appl. No.: 713,667

[22] Filed: Jun. 11, 1991

[30] Foreign Application Priority Data

Jun. 20, 1990 [JP] Japan ................... 2-161936

[51] Int. Cl.$^5$ .............................. H02M 7/00
[52] U.S. Cl. ..................... 363/61; 363/126; 324/105; 324/119
[58] Field of Search ............ 363/59, 60, 61, 126; 324/105, 119; 323/907

[56] References Cited

U.S. PATENT DOCUMENTS

| | | | |
|---|---|---|---|
| 3,944,908 | 3/1976 | Oki | 363/60 |
| 4,259,641 | 3/1981 | Carow | 363/126 |
| 4,970,456 | 11/1990 | Holcomb et al. | 324/105 |
| 5,043,672 | 8/1991 | Youn | 330/129 |

*Primary Examiner*—Peter S. Wong
*Attorney, Agent, or Firm*—Emmanuel J. Lobato; Robert E. Burns

[57] ABSTRACT

A temperature compensated level detector is disclosed in which a voltage multiplying rectifier is provided for rectifying and smoothing a high-frequency input voltage to obtain a DC output, and a bias voltage generator is added to said voltage multiplying rectifier, for providing a forward bias voltage. The bias voltage generator has a temperature compensating function.

3 Claims, 2 Drawing Sheets

TEMPERATURE COMPENSATED LEVEL DETECTOR

BACKGROUND OF THE INVENTION

The present invention relates to a level detector which is used primarily in a transmitting section or the like of radio communication equipment, for detecting a voltage corresponding to the transmission output so as to suppress its variation by controlling the amplification degree of a transmitting power amplifier. More particularly, the invention pertains to a temperature-compensation typed level detector which is less affected by ambient temperature changes.

In the transmitting power amplifier of the final stage in the transmitting section of radio communication equipment there is provided an automatic output control circuit for holding the transmission output to be substantially constant at all times. That is, when a voltage corresponding or proportional to the transmission output is detected, the detected output is compared with a predetermined reference voltage, and the amplification degree or gain of the power amplifier is controlled so that a difference between the detected output and the reference voltage may be reduced to zero, thereby suppressing variations in the transmission output.

However, prior art has defects such as difficulty in setting an optimum value of the bias voltage of a rectifier, or difficulty in miniaturization.

SUMMARY OF THE INVENTION

An object of the present invention is to provide a temperature compensation typed level detector which is free from the limitations on the circuit design and the limit of miniaturization experienced in the prior art and which allows freedom in the circuit design to provide for enhanced stability and permits miniaturization of the circuit.

The temperature compensated level detector of the present invention is provided with a voltage multiplying rectifier for rectifying and smoothing a high-frequency input voltage to obtain a DC output and a bias voltage generator added to the voltage multiplying rectifier, for providing a forward bias voltage, the bias voltage generator having a temperature compensating function.

The voltage multiplying rectifier is composed of: a first diode having a cathode terminal and an anode terminal to which the high-frequency input voltage is applied; a second diode having its cathode terminal connected to the anode terminal of the first diode; a first capacitor connected between the anode terminal of the second diode and the ground; and a second capacitor and a first resistor connected in parallel between the cathode terminal of the first diode and the ground, for obtaining the DC output by smoothing a voltage which appears between the cathode terminal of the first diode and a grounding terminal of the first capacitor.

The bias voltage generator is composed of: an NPN type or PNP type transistor having its collector and emitter terminals connected between the anode terminal of the second diode and the ground; a second resistor connected between the base and collector terminals of the transistor; and a third resistor connected between the anode terminal of the second diode and a DC power source.

BRIEF DESCRIPTION OF THE DRAWINGS

The present invention will be described in detail below in comparison with prior art with reference to the accompanying drawings, in which.

DETAILED DESCRIPTION

At first a power amplifier, to which the present invention will be described.

Figure 1:
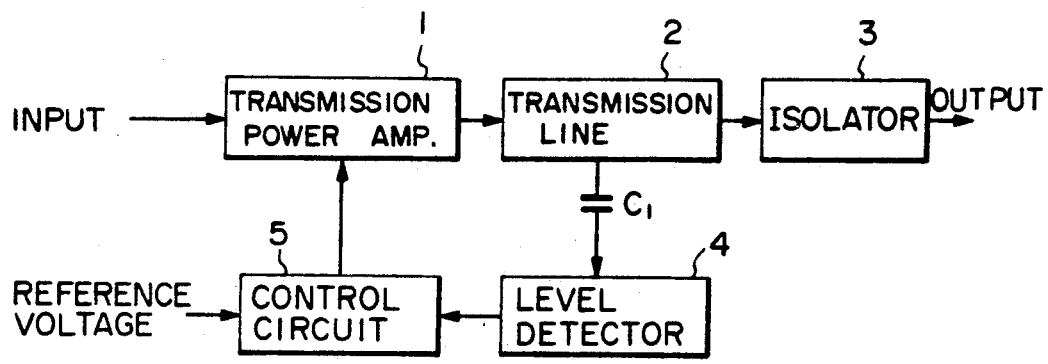
FIG. 1 is a block diagram of a power amplifying section to which the present invention is applied.

FIG. 1 is a block diagram showing the outline of such a conventional power amplifier. As shown, a modulated high-frequency input is amplified by a transmitting power amplifier 1 and is then sent out as the transmission output via a directional coupler or transmission line (or wire) 2 and an isolator 3. Reference character $C_1$ denotes a small-capacity coupling capacitor connected to the transmission line 2. This capacitor is set to a value such that a level detector 4 is loosely coupled with the transmission line 2. The level detector 4 converts the high-frequency voltage, taken out of the transmission line 2, into DC form and provides it to a control circuit 5, by which the DC input proportional to the transmission output is compared with a predetermined reference voltage and the amplification degree of the transmitting power amplifier 1 is controlled so that a difference between them may be reduced to zero.

The present invention is directed to the level detector 4 in FIG. 1. A description will be given below of the conventional circuit and its problem.

Figure 3:
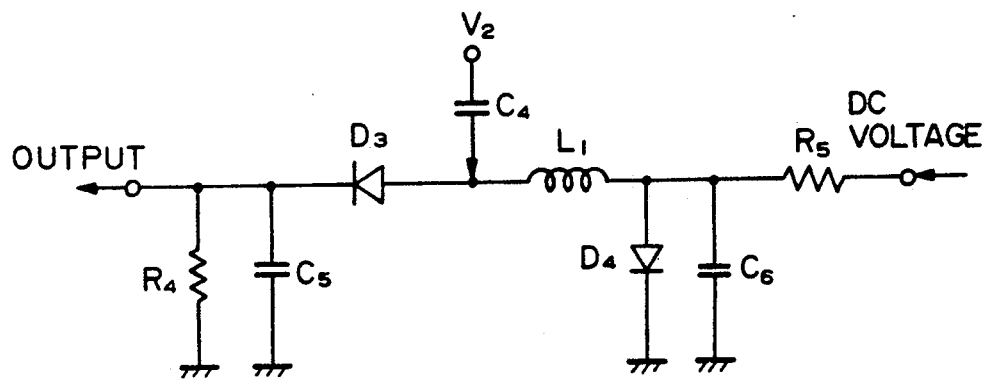
FIG. 3 is a circuit diagram of a prior art example.

FIG. 3 is a circuit diagram of the conventional level detector 4. This circuit is a temperature-compensation typed level detector. A high-frequency signal $V_2$ in a transmitting power amplifying section, taken out via a coupling capacitor $C_4$, is rectified, by a half-wave rectifier composed of a diode $D_3$, a smoothing capacitor $C_5$ and a load resistor $R_4$, into a DC voltage for output. A resistor $R_5$, a diode $D_4$ and a capacitor $C_6$ are connected via an AC blocking coil $L_1$ to that terminal (or the anode terminal) of the diode $D_3$ to which the high-frequency signal is applied, and the diode $D_3$ is supplied at that terminal with a forward bias voltage for causing it to perform a linear operation. The diode $D_4$ has the same temperature characteristic as that of the diode $D_3$, and when the ambient temperature changes, their forward drop voltages also change simultaneously and the DC output voltage of the level detector 4 induced across the load resistor $R_4$ has no longer temperature dependency, accordingly, the DC output voltage corresponding to the level of the detected high-frequency voltage $V_2$ can be taken out.

However, the above-described conventional circuit has a defect that the bias voltage which is applied to the diode $D_3$ cannot be set to an optimum value for temperature compensation, because it is determined by the selection of the value of the resistor $R_5$ or the number of series connections of the diode $D_4$. Furthermore, the use of the half-wave rectifier lowers the detected level resolving power, imposing severe limitations on the circuit design. Besides, miniaturization of the circuit is limited by the individual use of the two diodes ($D_3$ and $D_4$) and the use of the coil $L_1$ difficult of miniaturization. This constitutes a serious obstacle to the miniaturization of the device.

With reference to the accompanying drawings, the invention will hereinafter be described in detail.

Figure 2A:
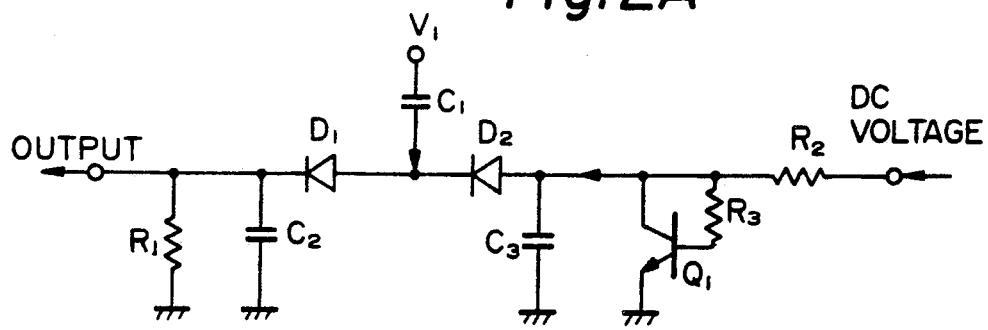
FIGS. 2A and 2B are circuit diagrams illustrating an embodiment of the present invention.
Figure 2B:
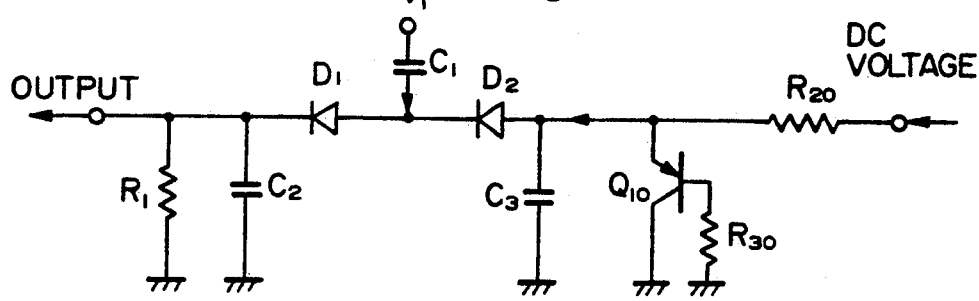

FIGS. 2A and 2B are circuit diagrams illustrating first and second embodiments of the present invention, FIG. 2A showing an example employing an NPN transistor and FIG. 2B an example employing a PNP transistor. In FIG. 2A, reference character $V_1$ indicates a detected high-frequency voltage, $C_1$ a small-capacitance coupling capacitor, $D_1$ and $D_2$ diodes for a multiplying rectifier, $C_3$ a capacitor for the multiplying rectifier, $R_1$ a load resistor for taking out a DC voltage as the output of the level detector, $C_2$ a capacitor for smoothing the rectified voltage, $R_2$ a resistor for providing a forward bias voltage for causing the diodes $D_1$ and $D_2$ to perform a linear operation, $Q_1$ a transistor for flowing its collector current through the resistor $R_2$, and $R_3$ a bias resistor for the transistor $Q_1$.

When the ambient temperature changes, the forward drop voltages of the diodes $D_1$ and $D_2$ change, and at the same time, the collector current of the transistor $Q_1$ also changes, causing a change in the drop voltage across the resistor $R_2$ as well. Hence, the DC output voltage induced across the load resistor $R_1$ has no longer temperature dependency, making it possible to take out the DC output voltage corresponding to the high-frequency voltage $V_1$.

FIG. 2A shows a case of using an NPN transistor as the transistor $Q_1$. On the other hand, FIG. 2B shows a case of using a PNP transistor as a transistor $Q_{10}$, a bias resistor $R_{30}$ being grounded.

As described above, the forward bias voltage which is applied to the diodes $D_1$ and $D_2$ forming the voltage multiplying rectifier can be freely set by selecting the values of the resistors $R_2$ and $R_3$ (or $R_{20}$ and $R_{30}$) of the circuit of the transistor $Q_1$ (or $Q_{10}$), and at the same time, the temperature characteristics of the forward drop voltages of the diodes $D_1$ and $D_2$ can completely be compensated for by the values of the resistors $R_2$ and $R_3$ (or $R_{20}$ and $R_{30}$).

As described above in detail, according to the present invention, it is possible to realize a level detector which has completely compensated for characteristic variations with ambient temperature changes ranging from $-30°$ C. to $+70°$ C., and the level detector includes the voltage multiplying rectifier, and hence is also excellent in the resolution of the detected level. This removes the limitations on the circuit design. Moreover, since the diodes $D_1$ and $D_2$ are mutually series-connected, it is possible to use one small dual diode now easily available, and since the coil difficult of miniaturization is not used, the circuit is miniaturized, which greatly contributes to the miniaturization of the device.

What I claim is:

1. A temperature compensated level detector, comprising: a voltage multiplying rectifier for rectifying and smoothing a high-frequency input voltage to obtain a DC output and a bias voltage generator added to said voltage multiplying rectifier, for providing a forward bias voltage, said bias voltage generator having a temperature compensating function;

said voltage multiplying rectifier comprising: a first diode having a cathode terminal and an anode terminal to which said high-frequency input voltage is applied; a second diode having its cathode terminal connected to said anode terminal of said first diode; a first capacitor connected between the anode terminal of said second diode and the ground; and a second capacitor and a first resistor connected in parallel between said cathode of said first diode and the ground, for obtaining said DC output by smoothing a voltage which appears between said cathode terminal of said first diode and a grounding terminal of said first capacitor; and said bias voltage generator comprising: a transistor having its collector and emitter terminals connected between said anode terminal of said second diode and the ground; a second resistor connected between base and collector terminals of said transistor; and a third resistor connected between said anode terminal of said second diode and a DC power source.

2. A temperature compensated level detector according to claim 1, in which said transistor is an NPN transistor.

3. A temperature compensated level detector according to claim 1, in which said transistor is a PNP transistor.

* * * * *